United States Patent
Coliukos et al.

(10) Patent No.: US 11,525,736 B2
(45) Date of Patent: Dec. 13, 2022

(54) TEMPERATURE MONITORING FOR PRINTED CIRCUIT BOARD ASSEMBLIES DURING MASS SOLDERING

(71) Applicant: INTERNATIONAL BUSINESS MACHINES CORPORATION, Armonk, NY (US)

(72) Inventors: Stevana Coliukos, Accord, NY (US); Bradley Zeman, Kingston, NY (US); Pourya Samari, Austin, TX (US); Michael Roth, Poughkeepsie, NY (US); Eric Mallery, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 16/743,116

(22) Filed: Jan. 15, 2020

(65) Prior Publication Data

US 2021/0215541 A1 Jul. 15, 2021

(51) Int. Cl.
*G01J 5/00* (2022.01)
*G01R 31/309* (2006.01)
(Continued)

(52) U.S. Cl.
CPC .......... *G01J 5/0096* (2013.01); *G01J 5/0044* (2013.01); *G01R 31/309* (2013.01); *G01J 5/48* (2013.01);
(Continued)

(58) Field of Classification Search
CPC .......... G01J 5/0096; G01J 5/0044; G01J 5/48; G01J 2005/0077; G01R 31/309; H05K 13/083
See application file for complete search history.

(56) References Cited

U.S. PATENT DOCUMENTS 3,803,413 A 4/1974 Vanzetti et al.
6,072,150 A 6/2000 Sheffer
(Continued)

FOREIGN PATENT DOCUMENTS

CN 202035259 U 11/2011
CN 107717168 A 2/2018
(Continued)

OTHER PUBLICATIONS

Hartless et al., "Automated thermographic inspection of surface mount solder joints," 1991 Eighth International Conference on Automotive Electronics, Oct. 1991, pp. 178-181. (Year: 1991).*

(Continued)

*Primary Examiner* — David P Porta
*Assistant Examiner* — Jeremy S Valentiner
(74) *Attorney, Agent, or Firm* — Anthony M. Pallone

(57) ABSTRACT

A computer determines one or more temperature sensitive components from a part details in a bill of materials for soldering on a printed circuit board assembly, where the bill of materials is a record comprising part details having a reference designator. The computer determines whether temperature sensitive components exist in the bill of materials. Based on determining that at least one of the temperature sensitive components exist in the bill of materials, the computer determines temperature limits for each temperature sensitive component based on the reference designator, monitors, using the thermographic cameras the measured temperatures of the temperature sensitive components during soldering in the reflow oven. Then, based on determining that the measured temperatures of the temperature sensitive components exceeds the temperature limits, the computer determines an elapsed time outside of the temperature limit when the measured temperatures of the temperature sensitive components exceeds the temperature limits.

18 Claims, 9 Drawing Sheets

(51) Int. Cl.
*H05K 13/08* (2006.01)
*G01J 5/48* (2022.01)

(52) U.S. Cl.
CPC .... *G01J 2005/0077* (2013.01); *H05K 13/083* (2018.08)

(56) References Cited

U.S. PATENT DOCUMENTS

| | | |
|---|---|---|
| 6,352,192 B1 | 3/2002 | Lee et al. |
| 6,360,935 B1 * | 3/2002 | Flake .................. H05K 3/3494 228/103 |
| 9,111,159 B2 | 8/2015 | Liu et al. |
| 9,563,739 B2 * | 2/2017 | Ferrill ..................... G06F 30/39 |
| 10,447,946 B2 * | 10/2019 | Pinter ....................... A63J 7/00 |
| 2016/0011061 A1 | 1/2016 | Hugo et al. |

FOREIGN PATENT DOCUMENTS

| | | | | |
|---|---|---|---|---|
| JP | 2003510676 A | * | 3/2003 | ......... G05D 23/1931 |
| JP | 2006322180 A | | 11/2006 | |
| JP | 2008135658 A | * | 6/2008 | ............... H05K 3/34 |
| JP | 2008136568 A | | 6/2008 | |

OTHER PUBLICATIONS

Mell et al., "The NIST Definition of Cloud Computing", National Institute of Standards and Technology, Special Publication 800-145, Sep. 2011, pp. 1-7.
Mok et al., "Thermal Indicating Package," IBM Technical Disclosure Bulletin, TDB, Jan. 1, 1987, pp. 3548-3550; IP.com, IPCOM000038445D, Jan. 31, 2005.

* cited by examiner

BILL OF MATERIALS - PN XXXXXX

| Reference Designator | Qty | Part Description | Supplier Part # | Supplier |
|---|---|---|---|---|
| C1810 | 1 | CAPACITOR CERAMIC, 1200PF, 5%, 100V, 0603, C0G | 1885C2A122JA01 | A |
| C1835 | 0 | CAPACITOR CERAMIC, 1000PF, 5%, 100V, 0603, C0G | 1885C2A102JA01 | A |
| DS1600 | 1 | DUAL LED(UP/DOWN), RIGHT ANGLE, T1, GREEN TOP, GREEN BOTTOM | H280CGD | B |
| DS1601 | 1 | LED, RIGHT ANGLE, T1, GREEN | H280CKGD | B |
| J200 | 0 | CONNECTOR, SHROUDED VERTICAL HEADER, 2X10 PINS, GOLD FINISH, 1.27MM PITCH | FTSH-110-01-L-DV-007-K | C |
| J1802 | 1 | CABLE JUMPER | 698017914 | D |
| J1801 | 1 | CABLE JUMPER | 698017919 | D |
| J42,J43,J44 | 3 | HEADER 2X5 RA | 430451022 | D |

TEMPERATURE MONITORING FOR PRINTED CIRCUIT BOARD ASSEMBLIES DURING MASS SOLDERING

BACKGROUND

The present invention relates, generally, to the field of computing, and more particularly to an automatic monitoring for printed circuit board assemblies during mass soldering.

Printed circuit board assembly (PCBA) are electronic components on a board used in electronics that mechanically supports and electrically connects the electronic components or electrical components using conductive tracks, pads and other features etched from one or more sheet layers of copper or other conductive substrate that is laminated onto and between sheet layers of a non-conductive substrate. Electronic components are generally soldered onto the board to both electrically connect and mechanically fasten them to the board.

Typically, PCBAs are comprised of dozens of component types including those which are considered Temperature Sensitive Components (TSCs), such as electrolytic capacitors, LEDs, fuses, or switches. If present, TSCs impose both time and temperature limitations on the thermal profile that can be used on the assembly and especially during soldering. This is because the component's peak body temperature and Time Above Liquidus (TAL) during reflow directly affects the reliability of the PCBA.

SUMMARY

According to one embodiment, a method, computer system, and computer program product for thermal image monitoring is provided. The present invention may include a computing device for monitoring measured temperatures in a reflow oven using one or more thermographic cameras. The computing device determines one or more temperature sensitive components from a plurality of part details in a bill of materials for soldering on a printed circuit board assembly (PCBA), where the bill of materials is a record comprising the plurality of part details having a reference designator. The computing device determines whether one or more temperature sensitive components exist in the bill of materials. Based on determining that at least one of the one or more temperature sensitive components exist in the bill of materials, the computing device determines temperature limits for each of the one or more temperature sensitive components based on the reference designator, and monitors, using the one or more thermographic cameras, the measured temperatures of the each of the one or more temperature sensitive components during soldering in the reflow oven. Then, based on determining that the measured temperatures of at least one of the one or more temperature sensitive components exceeds the temperature limits, the computing device determines an elapsed time outside of the temperature limit when the measured temperatures of the at least one of the one or more temperature sensitive components exceeds the temperature limits.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 5 depicts a bill of materials used in a PCB, according to an embodiment of the present invention.

DETAILED DESCRIPTION

Figure 1:
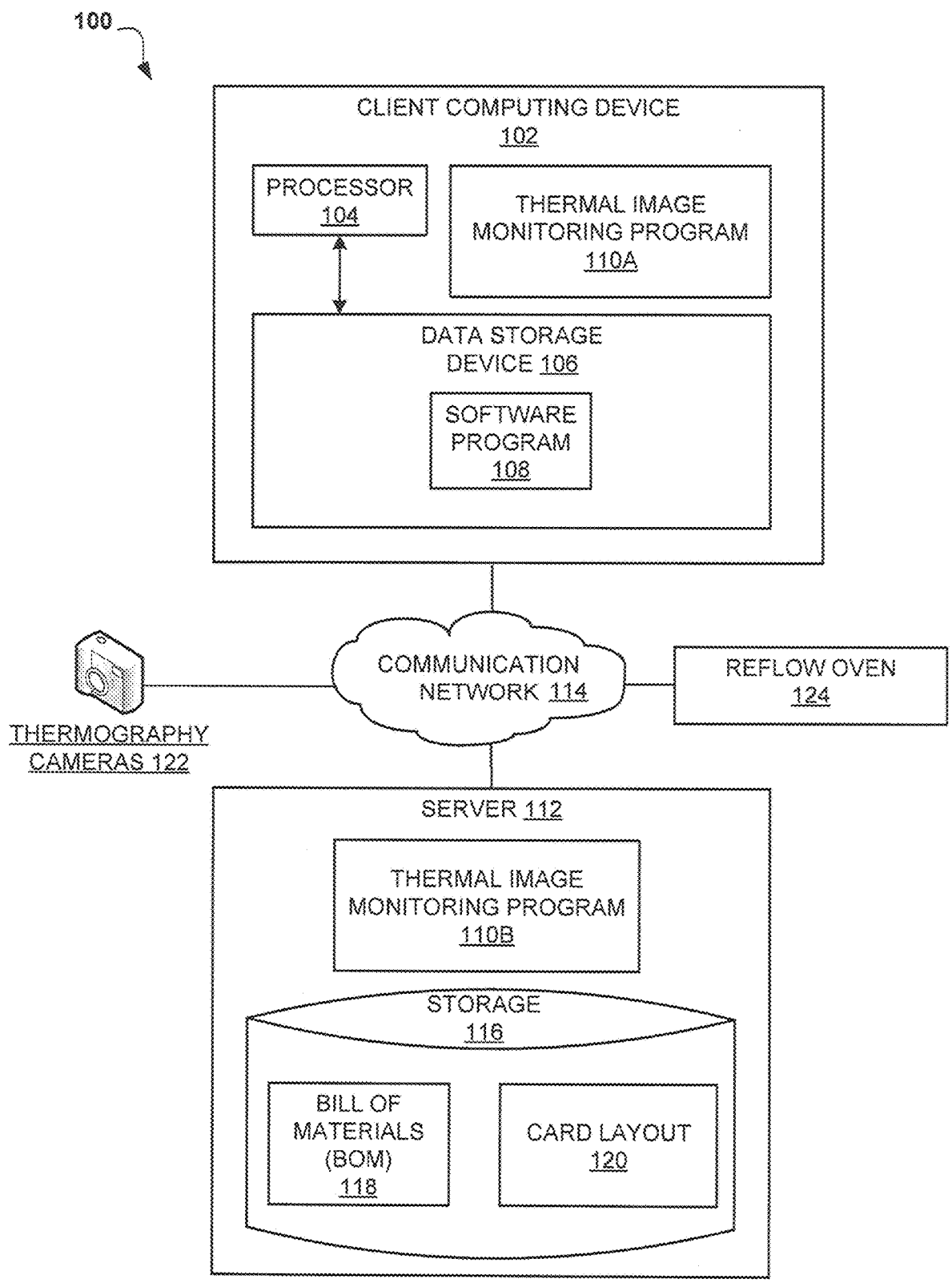
FIG. 1 illustrates an exemplary networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to the field of computing, and more particularly to an automatic monitoring for printed circuit board assemblies during mass soldering. The following described exemplary embodiments provide a system, method, and program product to, among other things, to automatic monitoring mass soldering process for printed circuit board assemblies and determining whether temperature sensitive components were soldered within a corresponding soldering temperature limits that include limitations on both time duration and temperatures. Therefore, the present embodiment has the capacity to improve the technical field of PCBA reliability during mass soldering by monitoring the soldering process by using an array of thermal cameras during the soldering process.

As previously described, PCBs are comprised of dozens of component types including those which are considered Temperature Sensitive Components (TSCs), such as electrolytic capacitors, LEDs, fuses, or switches. If present, TSCs impose both time and temperature limitations on the thermal profile that can be used on the assembly and especially during soldering. This is because the component's peak body temperature and Time Above Liquidus (TAL) during reflow directly affects the reliability of the PCB.

Typically, during the current process of mass soldering a designated test board is used to verify the thermal profile, usually once per day during the soldering or production line set up. The test board typically has a set of thermocouples attached to the desired components via solder or polyimide tape. When a tape is used to attach the set of thermocouples, there is a potential for the thermocouples to be misplaced or removed during the production line that may affect the readings. If an attachment of the set of thermocouples was done by soldering, it may be difficult to change the component being measured. Thus, when the TSCs are not monitored throughout production, there is currently no way to ensure that TSCs thermal limits have not been exceeded and that latent defects have not been induced during the soldering process of the PCBs. As such, it may be advantageous to, among other things, implement a system that determines a unique thermal profile for each TSC component and measures the actual temperature profile applied to each TSC during the mass soldering process by usage of a set of thermographic cameras installed in a reflow oven.

According to one embodiment, thermal image monitoring method may determine temperature sensitive components (TSCs) on a PCBA by analyzing the bill of materials and available documentation of the components. Whenever one or more TSCs are determined, their control limits that comprise temperature and time limits are extracted and incorporated into a monitoring profile that includes each TSC location and control limits. Then the soldering process is monitored using the monitoring profile by using thermographic cameras during soldering process in a reflow oven.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product for automatic monitoring of printed circuit board assemblies during mass soldiering by using one or more thermographic cameras.

Referring to FIG. 1, an exemplary networked computer environment 100 is depicted, according to at least one embodiment. The networked computer environment 100 may include client computing device 102, a server 112, thermographic cameras 122, and a reflow oven 124 interconnected via a communication network 114. According to at least one implementation, the networked computer environment 100 may include a plurality of client computing devices 102 and servers 112, of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Figure 7:
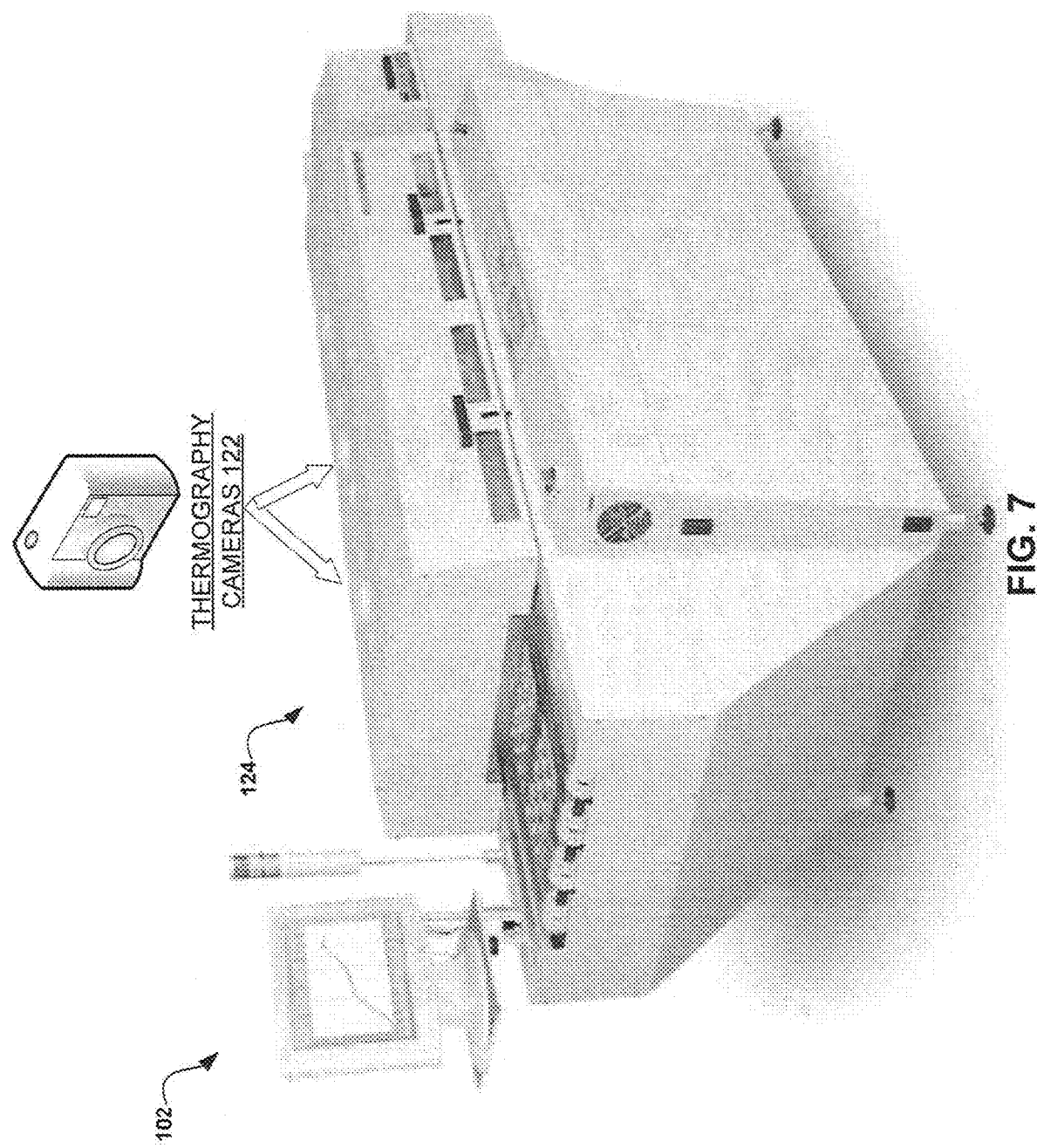
FIG. 7 depicts a reflow oven and locations of thermographic cameras, according to an embodiment of the present invention.

Client computing device 102 may include a processor 104 and a data storage device 106 that is enabled to host and run a software program 108 and a thermal image monitoring program 110A and communicate with the server 112 via the communication network 114, in accordance with one embodiment of the invention. Client computing device 102 may be, for example, a mobile device, a telephone, a personal digital assistant, a netbook, a laptop computer, a tablet computer, a desktop computer, or any type of computing device capable of running a program and accessing a network. According to an example embodiment, client computing device 102 may be incorporated into a reflow oven 124 that is used for mass soldering of PCBs, such as depicted in FIG. 7. In another embodiment, the reflow oven 124 may include a standalone computing device that may be controlled by a computing device 102. As will be discussed with reference to FIG. 4, the client computing device 102 may include internal components 402a and external components 404a, respectively.

Figure 6:
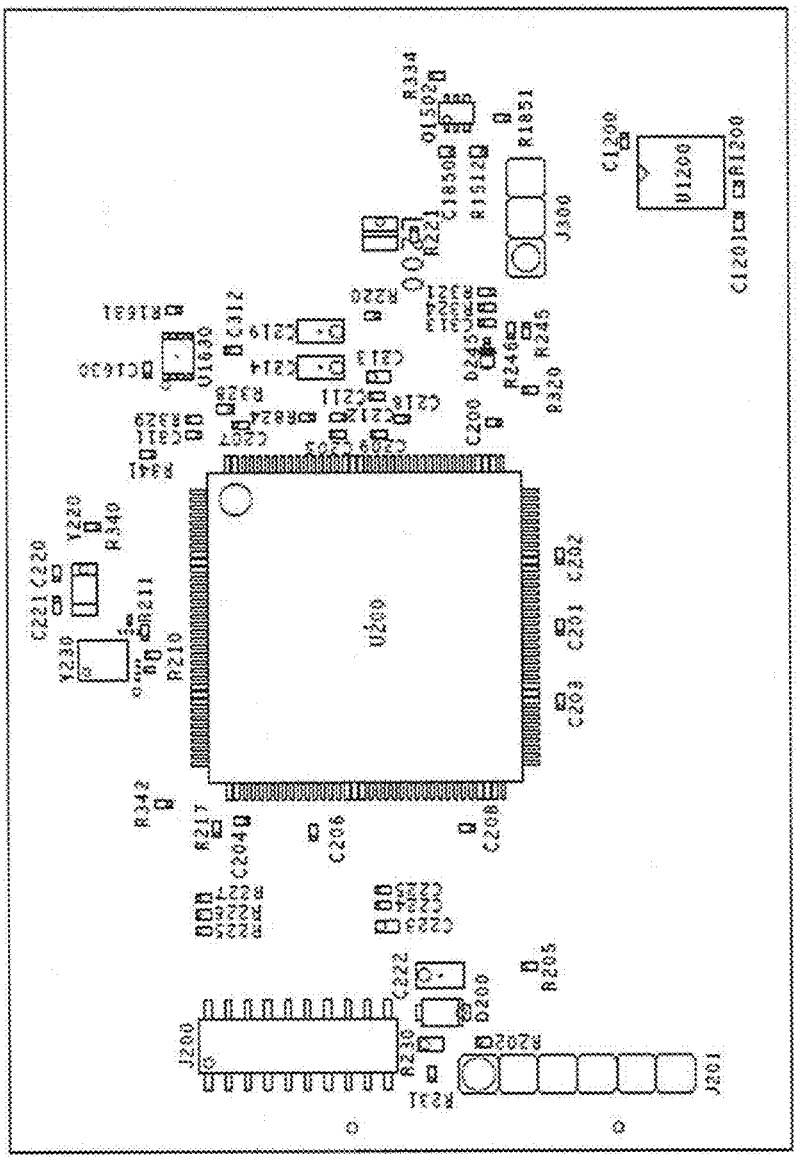
FIG. 6 depicts a card layout of a PCB, according to an embodiment of the present invention.

The server computer 112 may be a laptop computer, netbook computer, personal computer (PC), a desktop computer, or any programmable electronic device or any network of programmable electronic devices capable of hosting and running a thermal image monitoring program 110B and a storage 116 and communicating with the client computing device 102 via the communication network 114, in accordance with embodiments of the invention. The storage 116 may store a database that enables to store and access one or more bill of materials (BOM) 118 and PCBA card layouts 120. For example, BOM 118 may be a record or a data set that arranges all the electrical components that are attached to the PCBA and includes their identifiers and names as depicted in FIG. 6. As will be discussed with reference to FIG. 4, the server computer 112 may include internal components 402b and external components 404b, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

The reflow oven 124 may be a computerized mass soldering device designed for soldering printed circuit boards (PCBs) The reflow oven 124 may contain multiple zones, which may be individually controlled for temperature using a computing device. Typically, the reflow oven 124 may incorporate several heating zones followed by one or more cooling zones where the PCBA is designed to move through zones of the oven on a conveyor belt, and is therefore subjected to a controlled time-temperature profile. According to an example embodiment, the reflow oven 124 may incorporate the client computing device 102 and a set of thermographic cameras 122. In further embodiments, the reflow oven 124 may incorporate a 2D barcode reader that is configured to read a 2D barcode printed on the PCBA before soldering in order to associate the PCBA with a part number of the assembly and with the monitoring profile if the monitoring profile was generated for that assembly.

The thermographic cameras 122 may be devices that form a heat zone image by capturing the infrared radiation from electronic components, similar to a common camera that forms an image using visible light that may be incorporated or attached to the reflow oven and designed to take images during the soldering process of the PCBs. According to an example embodiment, the thermographic cameras may be installed in places designated for viewing windows of the reflow oven 124 as depicted in FIG. 7. According to an example embodiment, the thermographic cameras 122 may be designed to withstand high temperatures using water cooled jackets or other cooling or heat resisting technologies.

According to the present embodiment, the thermal image monitoring program 110A, 110B may be a program capable of determining temperature sensitive components and their location on the PCBA and monitoring the time and temperature during soldering using a set of thermographic cameras. The thermal image setup and monitoring methods are explained in further detail below with respect to FIGS. 2-3.

Figure 2:
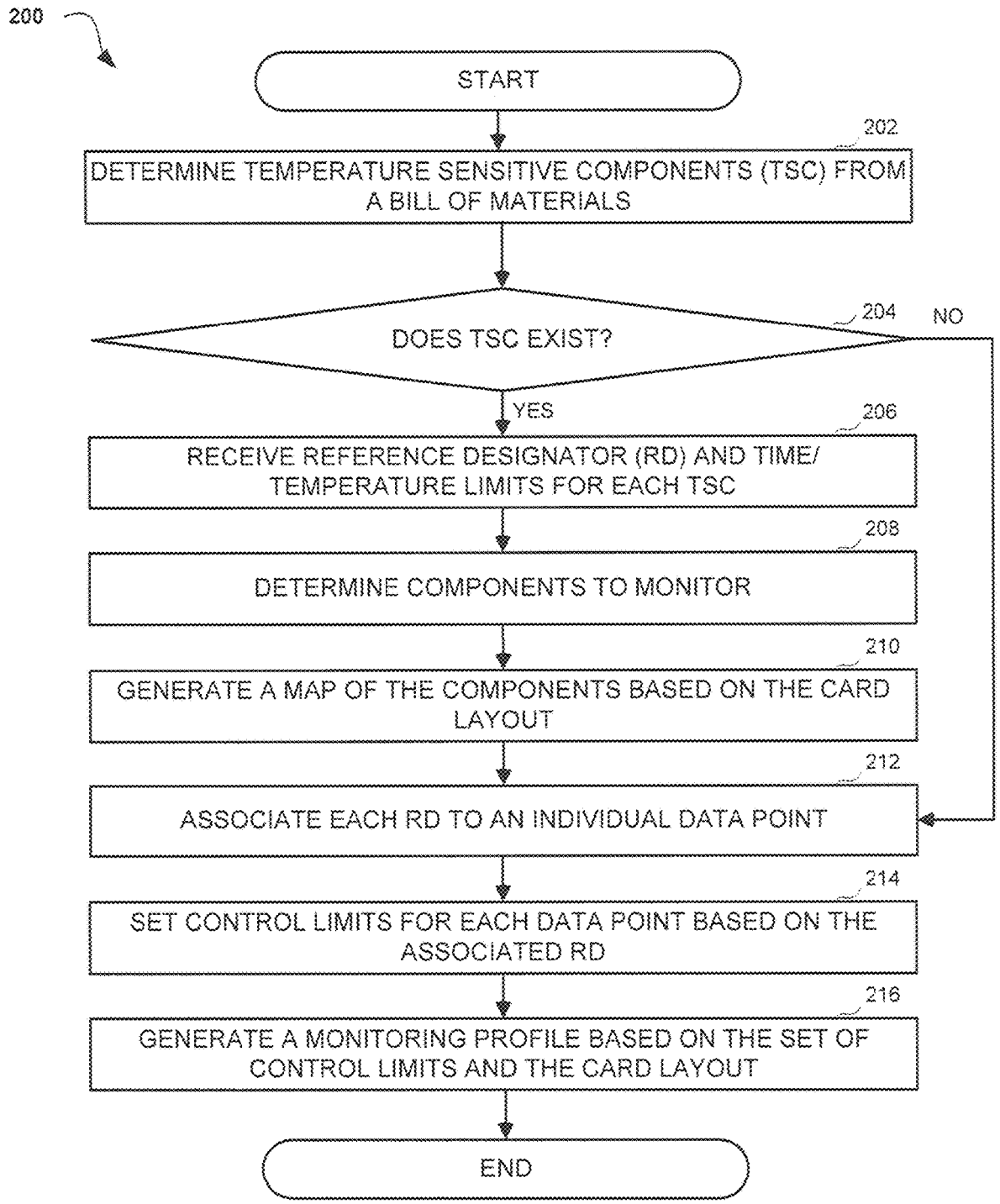
FIG. 2 is an operational flowchart illustrating a thermal imaging monitoring setup process according to at least one embodiment.

Referring now to FIG. 2, an operational flowchart illustrating thermal imaging monitoring setup process 200 is depicted according to at least one embodiment. At 202, the thermal image monitoring program 110A, 110B determines temperature sensitive components (TSCs) from a bill of materials. According to an example embodiment, thermal image monitoring program 110A, 110B may access the bill of materials 118 and determine for each part whether it is a TSC. An example of bill of materials is depicted in FIG. 5. For example, the thermal image monitoring program 110A, 110B may determine whether a component is a TSC by searching for soldering requirements for each component based on either reference designator, part description, or a part number coupled with a name of supplier. In another embodiment, bill of materials 118 may include a required soldering time and temperatures for each part or a dedicated flag that is checked when a part is a TSC. In further embodiments, thermal image monitoring program 110A, 110B may research the internet for each part and, using natural language processing, analyze each part documentation to extract soldering temperatures and maximum soldering time. In further embodiments, a user may determine a threshold temperature that may be coupled with a threshold time to define whether the part is a TSC. For example, when the thermal image monitoring program 110A, 110B determines that a specific parts temperature is above the threshold temperature then the specific part is a TSC.

Then, at 204, the thermal image monitoring program 110A, 110B determines whether a TSC exists. As previously mentioned, the thermal image monitoring program 110A, 110B may determine that there is at least one TSC by checking the temperatures of each part of the PCBA based on bill of materials 118. If the thermal image monitoring program 110A, 110B determines that at least one TSC exists, i.e. that at least one part exceeds a threshold temperature and a maximum time duration that was designated as a TSC in the bill of materials (step 204, "YES" branch), the thermal image monitoring program 110A, 110B may continue to step 206 to receive reference designator and time-temperature limits for each TSC. If the thermal image monitoring program 110A, 110B determines that no TSCs exist on the PCBA (step 204, "NO" branch), the thermal image monitoring program 110A, 110B may continue to step 212 to associate each reference designator to an individual data point.

Next at 206, the thermal image monitoring program 110A, 110B receives reference designator (RD) and time and temperature limits for each TSC. According to an example, the thermal image monitoring program 110A, 110B may determine the reference designator of each TSC by searching the bill of materials, see FIG. 5 (first row). The reference designator may be any index that associates TSC with its place on the PCBA using card layout 120 (See FIG. 6). As previously mentioned, thermal image monitoring program 110A, 110B may determine time and temperature limits by analyzing documentation of each TSC by using natural language processing. In another embodiment, thermal image monitoring program 110A, 110B may determine time and temperature limits of each TSC from bill of materials 118.

Then at 208, the thermal image monitoring program 110A, 110B determines components to monitor. According to an example embodiment, the thermal image monitoring program 110A, 110B monitors all the components that were identified as TSCs. In another embodiment, a user may add or remove components from monitoring, using a graphical user interface. For example, the thermal image monitoring program 110A, 110B may display the card layout 120 and, using a graphical user interface, allow the user to remove or add any part of the PCBA as a component for monitoring.

Next at 210, the thermal image monitoring program 110A, 110B generates a map of the components based on the card layout. According to an example embodiment, the thermal image monitoring program 110A, 110B may generate a map of the TSC locations based on locating TSCs on the card layout 120. According to an example embodiment, the thermal image monitoring program 110A, 110B may locate each TSC on the card layout 120 using a corresponding reference designator number from the bill of materials 118. According to an example embodiment, the map may be in a format of a card layout of only determined components to monitor, each with a shape representing the physical size of the component.

Then at 212, the thermal image monitoring program 110A, 110B associates each reference designator to an individual data point. According to an example embodiment, the thermal image monitoring program 110A, 110B may associate each reference designator with a data point on each shape representing the physical location of the components. In another embodiment, the thermal image monitoring program 110A, 110B may determine specific locations as an individual data point, such as soldering connectors of each component.

Next at 214, the thermal image monitoring program 110A, 110B sets control limits for each data point based on the associated reference designator. According to an example embodiment, the thermal image monitoring program 110A, 110B may have generated a data set that may be arranged as a database or a spreadsheet where each monitored component is associated with one or more datapoints and each datapoint is associated with control limits that include a temperature and a time duration. According to an example embodiment, the thermal image monitoring program 110A, 110B may set as control limits the maximum allowed temperature and time duration that the component is designed to withstand according to documentation. In another embodiment, the thermal image monitoring program 110A, 110B may set as control limits a certain percentage of the maximum allowed temperature and time duration that the component is designed to withstand according to documentation. In further embodiments, the thermal image monitoring program 110A, 110B may, in addition, allow the user to set the desired sets of control limits for each component.

Then, at 216, the thermal image monitoring program 110A, 110B generates a monitoring profile based on the sets of control limits and the card layout. According to an example embodiment, the thermal image monitoring program 110A, 110B may generate a monitoring profile that may include the set of control limits for each component and the physical location of each data point that needs to be monitored and may associate the generated monitoring profile with a part number of an assembly. The physical location may be either determined using image recognition or by calculating the physical location of each component using a distance of a thermographic camera, the speed of the conveyor of the reflow oven 124, the size of the PCBA and relative location of components based on the corresponding card layout 120. In further embodiments, at the thermal image monitoring program 110A, 110B may store the generated monitoring profile on the server 112 and, in addition, may associate the generated monitoring profile with a 2D barcode that is printed on the PCBA and the card layout 120 and represents the part number of the assembly.

Figure 3:
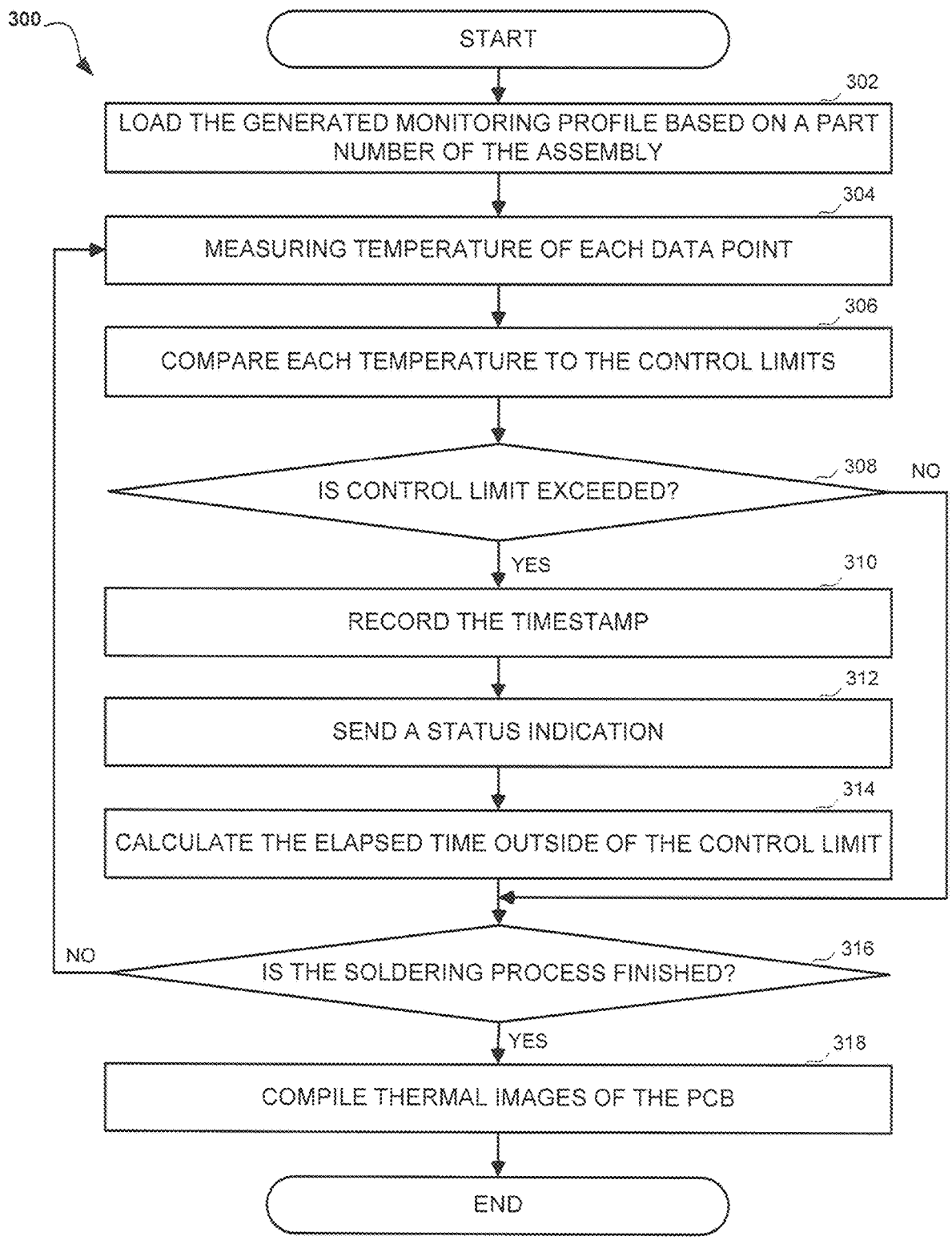
FIG. 3 is an operational flowchart illustrating a thermal imaging monitoring process according to at least one embodiment.

Referring now to FIG. 3, an operational flowchart illustrating thermal imaging monitoring process 300 is depicted according to at least one embodiment. At 302, the thermal image monitoring program 110A, 110B loads the generated monitoring profile based on a part number of the assembly. According to an example embodiment, the thermal image monitoring program 110A, 110B may load the generated monitoring profile either based on a part number of the assembly entered by a user or based on reading the 2D barcode that is associated with the part number of the assembly that is printed on the PCB.

Next, at 304, the thermal image monitoring program 110A, 110B measures temperatures of each data point. According to an example embodiment, the thermal image monitoring program 110A, 110B measures a temperature and a time stamp of each of the data points associated with the components on the PCBA using thermographic cameras, while the PCBA moves through the reflow oven 124.

Then, at 306, the thermal image monitoring program 110A, 110B compares each measured temperature to the control limits. According to an example embodiment, the thermal image monitoring program 110A, 110B may measure and compare temperatures to the control limits of each data point in real time. During measuring, the thermal image monitoring program 110A, 110B may set a flag that represents that the control limit temperature was exceeded by the measured temperature and record the timestamp for each event, when one or more events occurred.

Next, at 308, the thermal image monitoring program 110A, 110B determines whether the control limit is exceeded. As previously mentioned, the thermal image monitoring program 110A, 110B sets a specific flag the moment the measured temperature exceeds the control limit for any of the data points. If the thermal image monitoring program 110A, 110B determines that the control limit has been exceeded (step 308, "YES" branch), the thermal image monitoring program 110A, 110B may continue to step 310 to record the time stamp. If the thermal image monitoring program 110A, 110B determines that control limit is not exceeded (step 308, "NO" branch), the thermal image monitoring program 110A, 110B may continue to step 316 to determine whether the soldering process is finished.

Then, at 310, the thermal image monitoring program 110A, 110B may record the timestamp. According to an example embodiment, as previously mentioned, the moment one of the control limits exceeds the designated temperature for the corresponding control point, the thermal image monitoring program 110A, 110B may record the timestamp in order to determine time duration that the temperatures were above the control limits set for that control point. In another embodiment, in addition to timestamp recordation, the thermal image monitoring program 110A, 110B may take photographs and or video of each datapoint that has an excessive measured temperature.

Next, at 312, the thermal image monitoring program 110A, 110B sends a status indication. According to an example embodiment, the thermal image monitoring program 110A, 110B may send a status indication to a user by displaying that the measuring temperature of a specific datapoint was exceeded. In another embodiment, the thermal image monitoring program 110A, 110B may display the component on a card layout using a different color or emphasize the location where excessive temperature was measured. In another embodiment, the thermal image monitoring program 110A, 110B may stop the soldering process by sending an appropriate command to the overflow oven 124 or server 112.

Then, at 314, the thermal image monitoring program 110A, 110B calculates the elapsed time outside of the control limit. According to an example embodiment, the thermal image monitoring program 110A, 110B may calculate the elapsed time by subtracting from the current time the time that was recorded by the timestamp when the control limit exceeded for each of the data points. In another embodiment, the thermal image monitoring program 110A, 110B may create an array of timestamps for each data point that has a control point that exceeds the temperature limits. Then, at the end of soldering process, the thermal image monitoring program 110A, 110B may calculate the elapsed time outside of the control limit by summarizing all the time differences between two consecutive timestamps recorded in the array of timestamps.

Next, at 316, the thermal image monitoring program 110A, 110B determines whether the soldering process is finished. According to an example embodiment, the thermal image monitoring program 110A, 110B may determine that the process is finished by receiving a finish command from the overflow oven 124. In another embodiment, the thermal image monitoring program 110A, 110B may determine that the soldering process is over when the measured temperatures are below a temperature threshold value set by a user. If the thermal image monitoring program 110A, 110B determines that the soldering process is over (step 316, "YES" branch), the thermal image monitoring program 110A, 110B may continue to step 318 to compile thermal image of the PCB. If the thermal image monitoring program 110A, 110B determines that that the soldering process not finished (step 316, "NO" branch), the thermal image monitoring program 110A, 110B may continue to step 304 to continue measuring temperature of each data point.

Then, at 318, the thermal image monitoring program 110A, 110B compiles thermal images of the PCB. According to an example embodiment, the thermal image monitoring program 110A, 110B may generate and store a digital report that is associated with the part number of the assembly that may include one or more from all the recorded timestamps, calculated time durations, measured temperatures, control limits, thermal images, and thermal videos. In another embodiment, the recorded and calculated data may be incorporated into the generated monitoring profile. In further embodiment, the thermal image monitoring program 110A, 110B may display the thermal images on a displayed card layout with the calculated time duration, measured temperatures and control limits using a graphical user interface.

It may be appreciated that FIGS. 2-3 provide only an illustration of one implementation and does not imply any limitations with regard to how different embodiments may be implemented. Many modifications to the depicted environments may be made based on design and implementation requirements.

Figure 4:
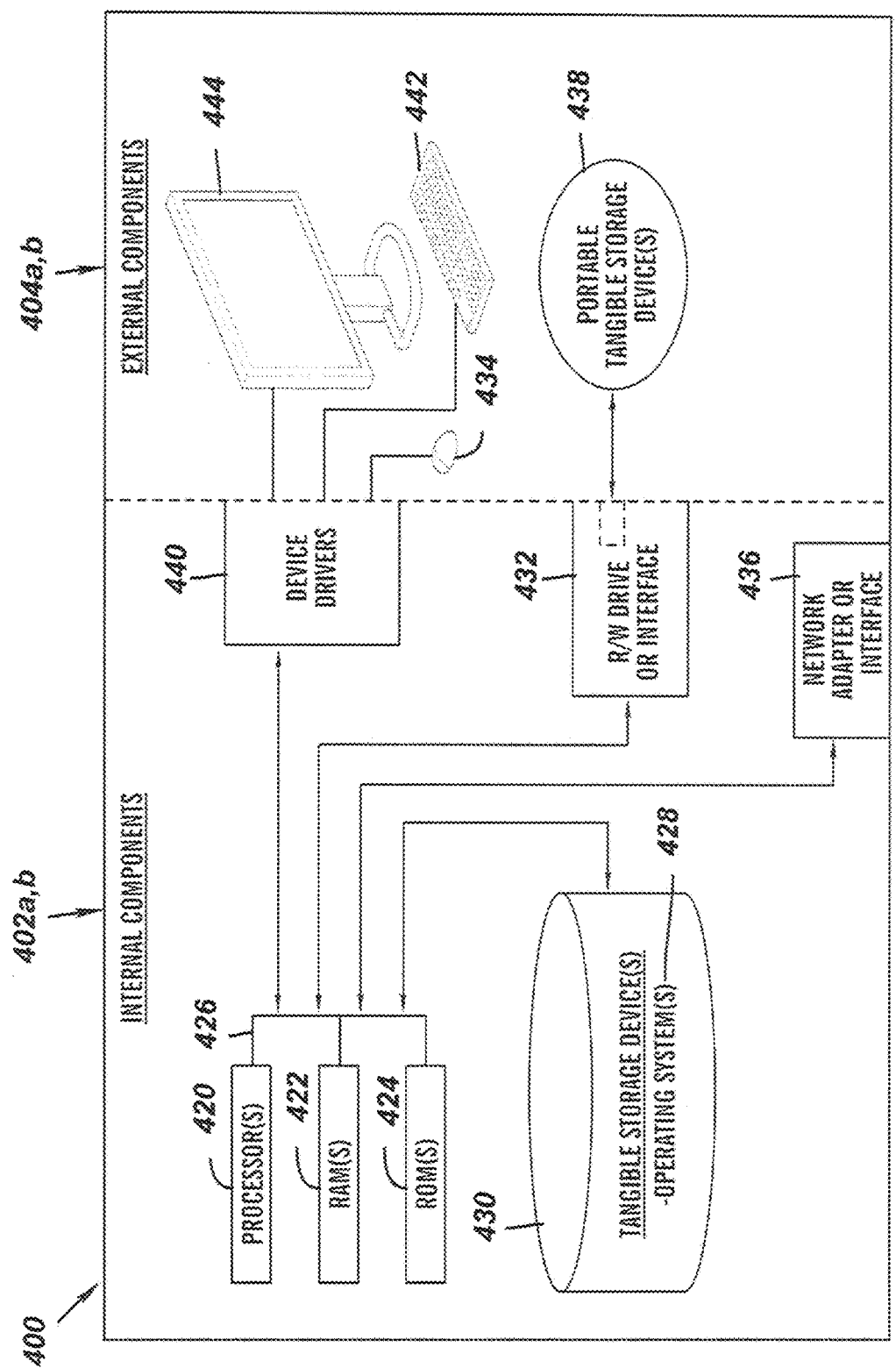
FIG. 4 is a block diagram of internal and external components of computers and servers depicted in FIG. 1 according to at least one embodiment.

FIG. 4 is a block diagram 400 of internal and external components of the client computing device 102 and the server 112 depicted in FIG. 1 in accordance with an embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

The data processing system 402, 404 is representative of any electronic device capable of executing machine-readable program instructions. The data processing system 402, 404 may be representative of a smart phone, a computer system, PDA, or other electronic devices. Examples of computing systems, environments, and/or configurations that may represented by the data processing system 402, 404 include, but are not limited to, personal computer systems, server computer systems, thin clients, thick clients, handheld or laptop devices, multiprocessor systems, microprocessor-based systems, network PCs, minicomputer systems, and distributed cloud computing environments that include any of the above systems or devices.

The client computing device 102 and the server 112 may include respective sets of internal components 402 a,b and external components 404 a,b illustrated in FIG. 4. Each of the sets of internal components 402 include one or more processors 420, one or more computer-readable RAMs 422, and one or more computer-readable ROMs 424 on one or more buses 426, and one or more operating systems 428 and one or more computer-readable tangible storage devices 430. The one or more operating systems 428, the software program 108 and the thermal image monitoring program 110A in the client computing device 102, and the thermal image monitoring program 110B in the server 112 are stored on one or more of the respective computer-readable tangible storage devices 430 for execution by one or more of the respective processors 420 via one or more of the respective RAMs 422 (which typically include cache memory). In the embodiment illustrated in FIG. 4, each of the computer-readable tangible storage devices 430 is a magnetic disk storage device of an internal hard drive. Alternatively, each of the computer-readable tangible storage devices 430 is a semiconductor storage device such as ROM 424, EPROM, flash memory or any other computer-readable tangible storage device that can store a computer program and digital information.

Each set of internal components 402 a,b also includes a R/W drive or interface 432 to read from and write to one or more portable computer-readable tangible storage devices 438 such as a CD-ROM, DVD, memory stick, magnetic tape, magnetic disk, optical disk or semiconductor storage device. A software program, such as the cognitive screen protection program 110A, 110B, can be stored on one or more of the respective portable computer-readable tangible storage devices 438, read via the respective R/W drive or interface 432, and loaded into the respective hard drive 430.

Each set of internal components 402 a,b also includes network adapters or interfaces 436 such as a TCP/IP adapter cards, wireless Wi-Fi interface cards, or 3G or 4G wireless interface cards or other wired or wireless communication links. The software program 108 and the thermal image monitoring program 110A in the client computing device 102 and the thermal image monitoring program 110B in the server 112 can be downloaded to the client computing device 102 and the server 112 from an external computer via a network (for example, the Internet, a local area network or other, wide area network) and respective network adapters or interfaces 436. From the network adapters or interfaces 436, the software program 108 and the thermal image monitoring program 110A in the client computing device 102 and the thermal image monitoring program 110B in the server 112 are loaded into the respective hard drive 430. The network may comprise copper wires, optical fibers, wireless transmission, routers, firewalls, switches, gateway computers and/or edge servers.

Each of the sets of external components 404 a,b can include a computer display monitor 444, a keyboard 442, and a computer mouse 434. External components 404 a,b can also include touch screens, virtual keyboards, touch pads, pointing devices, and other human interface devices. Each of the sets of internal components 402 a,b also includes device drivers 440 to interface to computer display monitor 444, keyboard 442, and computer mouse 434. The device drivers 440, R/W drive or interface 432, and network adapter or interface 436 comprise hardware and software (stored in storage device 430 and/or ROM 424).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Referring now to FIG. 5, a bill of materials used in a PCB, according to an embodiment of the present invention is depicted. According to an example embodiment, the bill of materials may be a record stored on the server 112 and includes at least reference designators for each part used in an assembled PCBA that is ready for soldering. In another embodiment, the bill of materials may include a part number of the assembly that corresponds to the card layout 120 of the same PCB. In another embodiment, the temperature sensitive components (TSCs) may be flagged in advance, for example 5 first lines in the bill of materials are marked to emphasize that they are TSCs that have a limitation on a maximum temperature and time duration during soldering.

Referring now to FIG. 6, a graphical representation of a card layout of a PCB, according to an embodiment of the present invention is depicted. According to an example embodiment, the card layout 120 may be a record that includes a physical measures of the PCBA and the layout of each of the parts from the corresponding bill of materials that enables to determine what is the size and location of each part and corresponding reference designator of each part used during the assembly of the PCB.

Referring now FIG. 7 a reflow oven 124 and locations of thermographic cameras 122, according to an embodiment of the present invention is depicted. According to an example embodiment, the reflow oven 124 may have a client computing device 102 and one or more thermographic cameras 122, where the thermographic cameras 122 may be installed in place of viewing windows, as depicted. In another embodiment, the reflow oven may be retrofitted with 2D bar scanner (not shown) that enables to associate the PCBA with the corresponding bill of materials 118 and card layout 120.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
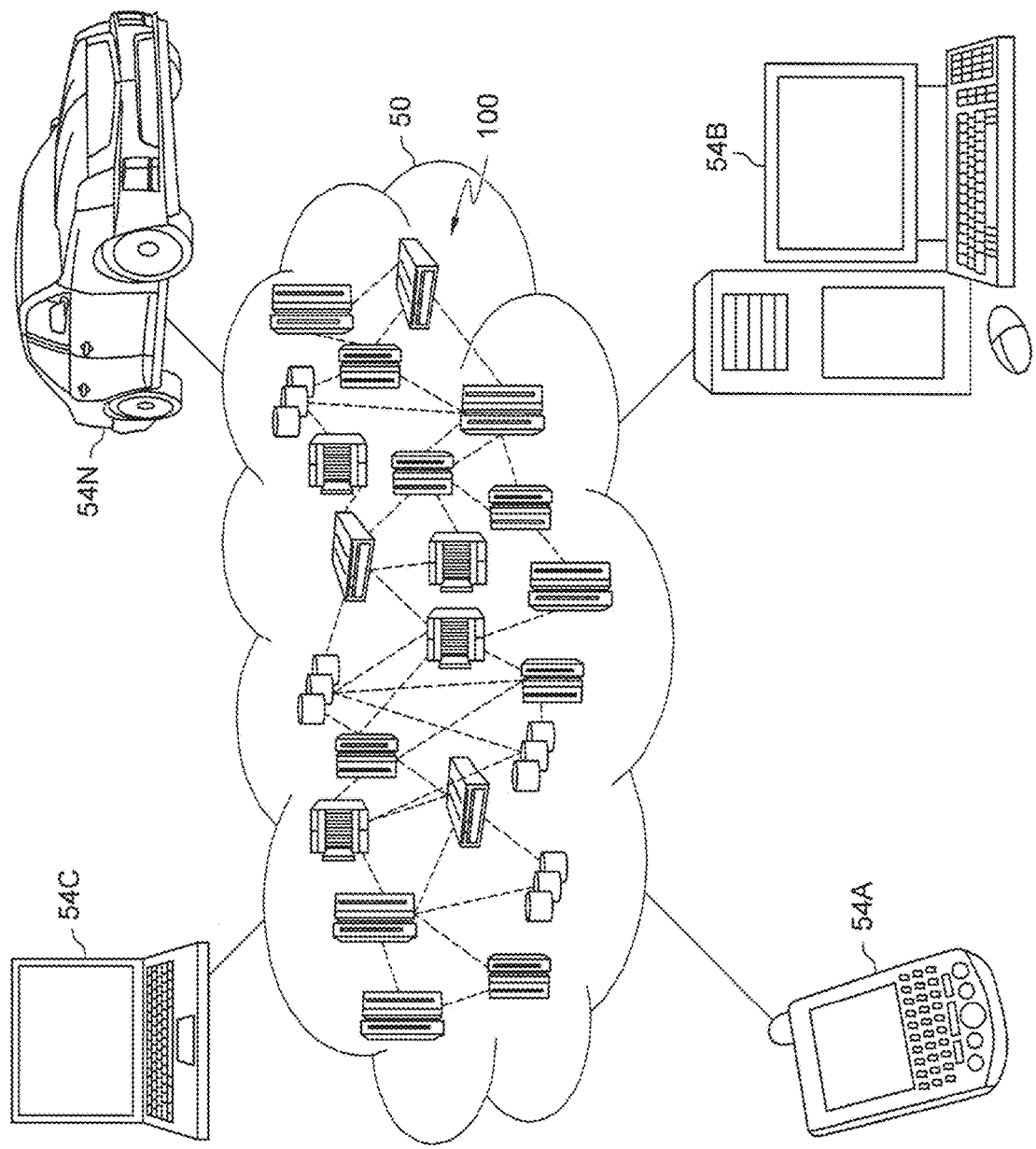
FIG. 8 depicts a cloud computing environment according to an embodiment of the present invention.

Referring now to FIG. 8, illustrative cloud computing environment 50 is depicted. As shown, cloud computing environment 50 comprises one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 100 and cloud computing environment 50 can communicate with any type of computerized device over any type of network and/or network addressable connection (e.g., using a web browser).

Figure 9:
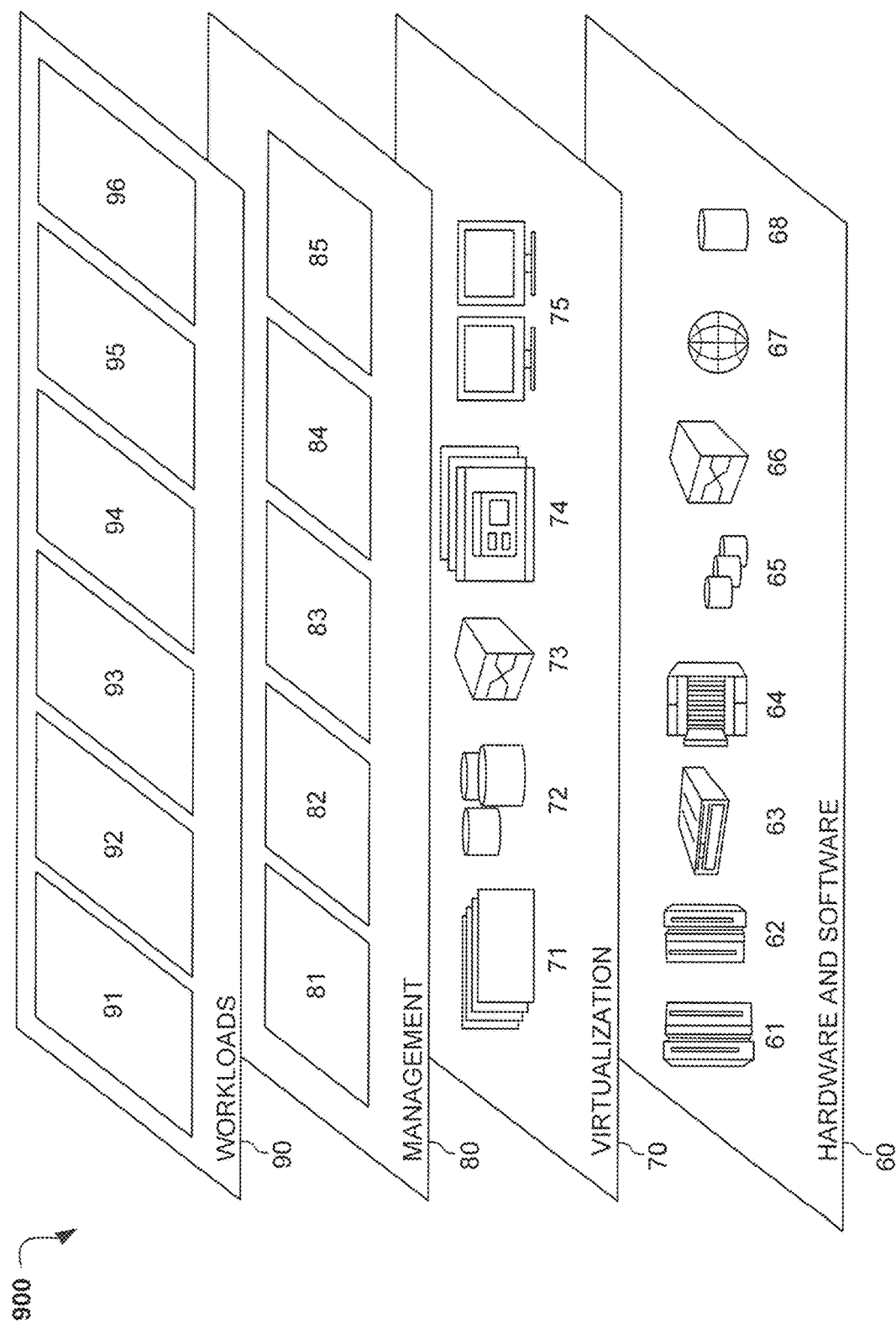
FIG. 9 depicts abstraction model layers according to an embodiment of the present invention.

Referring now to FIG. 9, a set of functional abstraction layers 500 provided by cloud computing environment 50 is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and thermal image monitoring 96. Thermal image monitoring 96 may relate to determining temperature sensitive components (TSCs) on a PCBA and after determining the TSCs control limits, monitoring the control limits using thermographic cameras during soldering process in a reflow oven.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for monitoring measured temperatures in a reflow oven using one or more thermographic cameras, the method comprising:
    determining one or more temperature sensitive components from a plurality of part details in a bill of materials for soldering on a printed circuit board assembly (PCBA) including the one or more temperature sensitive components and other components, wherein the bill of materials is a record comprising the plurality of part details having a reference designator;
    based on determining that at least one of the one or more temperature sensitive components exist in the bill of materials:
        determining temperature limits for each of the one or more temperature sensitive components based on the reference designator;
        monitoring, using the one or more thermographic cameras, the measured temperatures of the each of the one or more temperature sensitive components during soldering in the reflow oven;
        based on determining that the measured temperatures of at least one of the one or more temperature sensitive components exceeds the temperature limits, determining an elapsed time outside of the temperature limit when the measured temperatures of the measured temperatures of the each of the one or more temperature sensitive components exceeds the temperature limits; and
        based on determining that the measured temperatures of at least one of the one or more temperature sensitive components exceeds the temperature limits, sending a status indication, wherein the status indication comprises a card layout which displays the at least one of the one or more temperature sensitive components using a different color to emphasize a location where exceeding temperatures were measured.

2. The processor-implemented method of claim 1, wherein monitoring, using the one or more thermographic cameras, the measured temperatures of the each of the one or more temperature sensitive components during soldering process in the reflow oven further comprises:
    recording thermal images of the PCBA by the one or more thermographic cameras.

3. The processor-implemented method of claim 2 further comprising:
    based on determining that the soldering process in the reflow oven has finished, compiling the thermal images of the PCBA.

4. The processor-implemented method of claim 1, wherein determining temperature limits for each of the one or more temperature sensitive components further comprises using natural language processing to extract temperature limits and time duration limits from documentation associated with the reference designator.

5. The processor-implemented method of claim 1, wherein monitoring, using the one or more thermographic cameras, the measured temperatures of the each of the one or more temperature sensitive components during soldering in the reflow oven further comprises:
    determining a physical location of the each of the one or more temperature sensitive components using a card layout; and
    monitoring the measured temperatures that are associated with the physical location of each of the one or more temperature sensitive components.

6. The processor-implemented method of claim 1, wherein determining the elapsed time outside of the temperature limit when the measured temperatures of the measured temperatures of the each of the one or more temperature sensitive components exceeds the temperature limits, further comprises:
    recording a plurality of time stamps each time when the measured temperatures of the measured temperatures of the each of the one or more temperature sensitive components exceeds the temperature limits; and
    calculating the elapsed time outside of the temperature limit using the recorded plurality of time stamps.

7. A computer system for monitoring measured temperatures in a reflow oven using one or more thermographic cameras, the computer system comprising:
    one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
        determining one or more temperature sensitive components from a plurality of part details in a bill of materials for soldering on a printed circuit board assembly (PCBA) including the one or more temperature sensitive components and other components, wherein the bill of materials is a record comprising the plurality of part details having a reference designator;
        based on determining that at least one of the one or more temperature sensitive components exist in the bill of materials:
            determining temperature limits for each of the one or more temperature sensitive components based on the reference designator;
            monitoring, using the one or more thermographic cameras, the measured temperatures of the each of the one or more temperature sensitive components during soldering in the reflow oven;
            based on determining that the measured temperatures of at least one of the one or more temperature sensitive components exceeds the temperature limits, determining an elapsed time outside of the temperature limit when the measured temperatures of the measured temperatures of the each of the one or more temperature sensitive components exceeds the temperature limits: and
            based on determining that the measured temperatures of at least one of the one or more temperature sensitive components exceeds the temperature limits, sending a status indication, wherein the status indication comprises a card layout which displays the at least one of the one or more temperature sensitive components using a different color to emphasize a location where exceeding temperatures were measured.

8. The computer system of claim 7, wherein monitoring, using the one or more thermographic cameras, the measured temperatures of the each of the one or more temperature sensitive components during soldering process in the reflow oven further comprises:
recording thermal images of the PCBA by the one or more thermographic cameras.

9. The computer system of claim 8 further comprising:
based on determining that the soldering process in the reflow oven has finished, compiling the thermal images of the PCBA.

10. The computer system of claim 7, wherein determining temperature limits for each of the one or more temperature sensitive components further comprises using natural language processing to extract temperature limits and time duration limits from documentation associated with the reference designator.

11. The computer system of claim 7, wherein monitoring, using the one or more thermographic cameras, the measured temperatures of the each of the one or more temperature sensitive components during soldering in the reflow oven further comprises:
determining a physical location of each of the one or more temperature sensitive components using a card layout; and
monitoring the measured temperatures that are associated with the physical location of each of the one or more temperature sensitive components.

12. The computer system of claim 7, wherein determining the elapsed time outside of the temperature limit when the measured temperatures of the measured temperatures of the each of the one or more temperature sensitive components exceeds the temperature limits, further comprises:
recording a plurality of time stamps each time when the measured temperatures of the measured temperatures of the each of the one or more temperature sensitive components exceeds the temperature limits; and
calculating the elapsed time outside of the temperature limit using the recorded plurality of time stamps.

13. A computer program product for monitoring measured temperatures in a reflow oven using one or more thermographic cameras, the computer program product comprising:
one or more computer-readable tangible storage medium and program instructions stored on at least one of the one or more tangible storage medium, the program instructions executable by a processor, the program instructions comprising:
program instructions to determine one or more temperature sensitive components from a plurality of part details in a bill of materials for soldering on a printed circuit board assembly (PCBA) including the one or more temperature sensitive components and other components, wherein the bill of materials is a record comprising the plurality of part details having a reference designator;
based on determining that at least one of the one or more temperature sensitive components exist in the bill of materials:
program instructions to determine temperature limits for each of the one or more temperature sensitive components based on the reference designator;
program instructions to monitor, using the one or more thermographic cameras, the measured temperatures of the each of the one or more temperature sensitive components during soldering in the reflow oven;
based on determining that the measured temperatures of at least one of the one or more temperature sensitive components exceeds the temperature limits, program instructions to determine an elapsed time outside of the temperature limit when the measured temperatures of the each of the one or more temperature sensitive components exceeds the temperature limits: and
based on determining that the measured temperatures of at least one of the one or more temperature sensitive components exceeds the temperature limits, program instructions to send a status indication, wherein the status indication comprises a card layout which displays the at least one of the one or more temperature sensitive components using a different color to emphasize a location where exceeding temperatures were measured.

14. The computer program product of claim 13, wherein program instructions to monitor, using the one or more thermographic cameras, the measured temperatures of the each of the one or more temperature sensitive components during soldering process in the reflow oven further comprises:
recording thermal images of the PCBA by the one or more thermographic cameras.

15. The computer program product of claim 14 further comprising:
based on determining that the soldering process in the reflow oven has finished, program instructions to compile the thermal images of the PCBA.

16. The computer program product of claim 13, wherein program instructions to determine temperature limits for each of the one or more temperature sensitive components further comprises program instructions to use natural language processing to extract temperature limits and time duration limits from documentation associated with the reference designator.

17. The computer program product of claim 13, wherein program instructions to monitor, using the one or more thermographic cameras, the measured temperatures of the each of the one or more temperature sensitive components during soldering in the reflow oven further comprises:
program instructions to determine a physical location of each of the one or more temperature sensitive components using a card layout; and
program instructions to monitor the measured temperatures that are associated with the physical location of each of the one or more temperature sensitive components.

18. The computer program product of claim 13, wherein program instructions to determine the elapsed time outside of the temperature limit when the measured temperatures of the measured temperatures of the each of the one or more temperature sensitive components exceeds the temperature limits, further comprises:
program instructions to record a plurality of time stamps each time when the measured temperatures of the measured temperatures of the each of the one or more temperature sensitive components exceeds the temperature limits; and program instructions to calculate the elapsed time outside of the temperature limit using the recorded plurality of time stamps.

\* \* \* \* \*